United States Patent
Cok

(10) Patent No.: US 8,013,516 B2
(45) Date of Patent: Sep. 6, 2011

(54) LED DEVICE HAVING IMPROVED POWER DISTRIBUTION

(75) Inventor: Ronald S. Cok, Rochester, NY (US)

(73) Assignee: Global OLED Technology LLC, Herndon, VA (US)

( * ) Notice: Subject to any disclaimer, the term of this patent is extended or adjusted under 35 U.S.C. 154(b) by 723 days.

(21) Appl. No.: 12/018,531

(22) Filed: Jan. 23, 2008

(65) Prior Publication Data

US 2009/0184636 A1 Jul. 23, 2009

(51) Int. Cl.
*H01L 51/50* (2006.01)
*H01L 51/52* (2006.01)
(52) U.S. Cl. .................. 313/503; 313/506; 313/509
(58) Field of Classification Search .......... 313/500–512
See application file for complete search history.

(56) References Cited

U.S. PATENT DOCUMENTS

| | | |
|---|---|---|
| 4,769,292 A | 9/1988 | Tang et al. |
| 5,061,569 A | 10/1991 | VanSlyke et al. |
| 6,876,007 B2 * | 4/2005 | Yamazaki et al. ............ 313/503 |
| 6,908,696 B2 * | 6/2005 | Imamura et al. ............. 313/503 |
| 6,995,053 B2 | 2/2006 | Schuele et al. |
| 7,030,553 B2 | 4/2006 | Winters et al. |
| 2003/0038594 A1 * | 2/2003 | Seo et al. ...................... 313/506 |
| 2005/0116620 A1 * | 6/2005 | Kobayashi ................... 313/503 |
| 2005/0127820 A1 * | 6/2005 | Yamazaki et al. ............ 313/501 |

FOREIGN PATENT DOCUMENTS

WO 2006/111766 10/2006

OTHER PUBLICATIONS

U.S. Appl. No. 11/683,479, filed Mar. 8, 2007, Kahen.

* cited by examiner

*Primary Examiner* — Mariceli Santiago
(74) *Attorney, Agent, or Firm* — Morgan, Lewis & Bockius LLP

(57) ABSTRACT

An LED device that includes electrodes patterned over a substrate; the pattern forming several first electrodes separated by inter-electrode spacers. One or more light-emitting layers are formed over the first electrodes. A patterned conductive layer is formed over the one or more light-emitting layers and over the first electrodes in regions external to the inter-electrode spacers. A continuous unpatterned conductive layer is formed over both the patterned conductive layer and the inter-electrode spacers. Finally, a combination of the patterned and continuous unpatterned conductive layers form a single, bi-layered, electrically continuous second electrode.

8 Claims, 7 Drawing Sheets

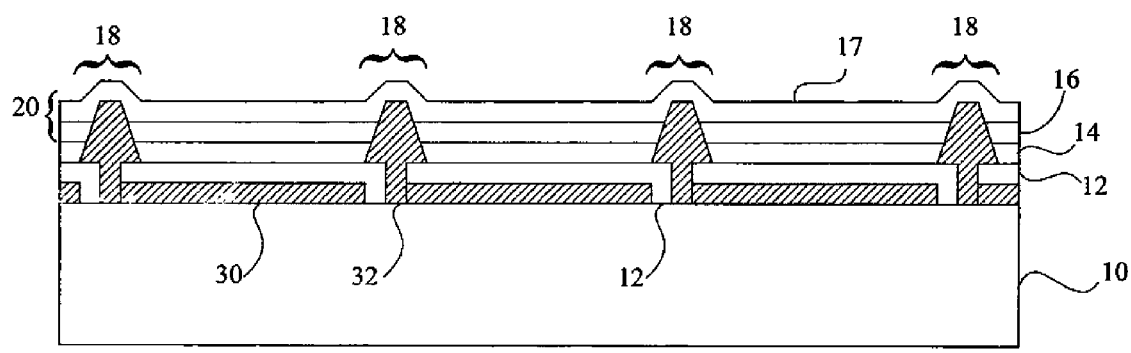
Fig. 1
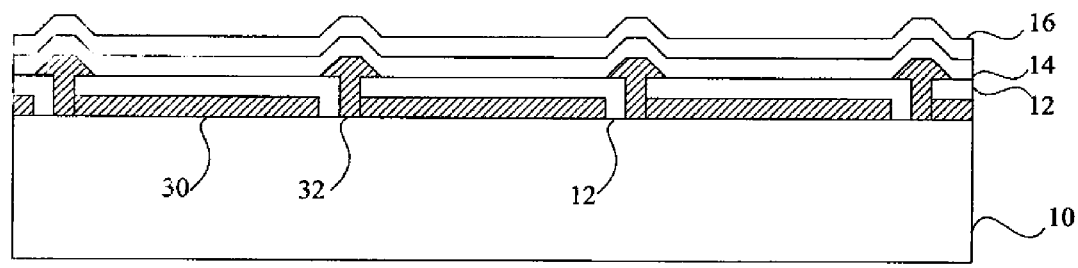
Fig. 6 - Prior Art

LED DEVICE HAVING IMPROVED POWER DISTRIBUTION

FIELD OF THE INVENTION

The present invention relates to top-emitting light-emitting diode (LED) devices and, more particularly, to an LED device having improved manufacturing yields and power distribution in an upper electrode, and a method of making thereof.

BACKGROUND OF THE INVENTION

Light-emitting diode (LED) devices, also referred to as electroluminescent (EL) devices, have numerous well-known advantages over other flat-panel display devices currently in the market place. Among these advantages are brightness of light emission, relatively wide viewing angle, and reduced electrical power consumption compared to, for example, liquid crystal displays (LCDs) using backlighting. Such devices may be made with light-emitting layers comprising organic materials or inorganic materials such as quantum dots.

Applications of LED devices include active-matrix image displays, passive-matrix image displays, and area-lighting devices such as, for example, selective desktop lighting. Irrespective of the particular LED device configuration tailored to these broad fields of applications, all LEDs function on the same general principles. An electroluminescent (EL) medium structure is formed between two electrodes. At least one of the electrodes is light transmissive. These electrodes are commonly referred to as an anode and a cathode in analogy to the terminals of a conventional diode. When an electrical potential is applied between the electrodes so that the anode is connected to the positive terminal of a voltage source and the cathode is connected to the negative terminal, the LED is said to be forward biased. Positive charge carriers (holes) are injected from the anode into the EL medium structure, and negative charge carriers (electrons) are injected from the cathode. Such charge-carrier injection causes current flow from the electrodes through the EL medium structure. Recombination of holes and electrons within a zone of the EL medium structure results in emission of light from this zone that is, appropriately, called the light-emitting zone or interface. The emitted light is directed towards an observer, or towards an object to be illuminated, through the light-transmissive electrode. If the light-transmissive electrode is between the substrate and the light-emissive elements of the LED device, the device is called a bottom-emitting LED device. Conversely, if the light-transmissive electrode is not between the substrate and the light-emissive elements, the device is referred to as a top-emitting LED device.

The EL medium structure can be formed of a stack of sublayers comprising organic materials that can include small-molecule layers and polymer layers. Such organic layers and sublayers are well known and understood by those skilled in the OLED art, for example U.S. Pat. No. 4,769,292, issued Sep. 6, 1988 to Tang et al., and U.S. Pat. No. 5,061,569, issued Oct. 29, 1991 to VanSlyke et al. Alternatively, inorganic materials may be employed to form the EL medium structure, for example including core/shell quantum dots formed in a polycrystalline, semiconductor matrix, for example, as taught in pending U.S. application Ser. No. 11/683,479, by Kahen.

Referring to FIG. 6, a top-emitting active-matrix prior-art LED device comprises a substrate 10 having thin-film electronic components 30 formed thereon. A plurality of patterned electrodes 12 separated by electrically insulating materials 32 are covered by a light-emitting layer or layers 14. The light-emitting layers 14 may include charge-control layers such as are known in the art and may, or may not, be patterned with different materials to provide different colored light output over different patterned electrodes 12. Alternatively, the same materials may be employed in the light-emitting layer 14 and a white light emitted. An unpatterned continuous electrode 16 is formed over the light-emitting layers. Upon the provision of a current flow through the light-emitting layer 14 from the electrodes 12, 16 in response to the thin-film electronic elements 30, light is emitted.

LED devices can employ a variety of light-emitting materials patterned over a substrate that emit light of a variety of different frequencies, for example red, green, and blue, to create a full-color display. For small-molecule organic materials, such patterned deposition is done by evaporation and is quite difficult, requiring, for example, expensive metal shadow-masks. Each mask is unique to each pattern and device design. These masks are difficult to fabricate and must be cleaned and replaced frequently. Material deposited on the mask in prior manufacturing cycles may flake off and cause particulate contamination. Moreover, aligning shadow-masks with a substrate is problematic and often damages the materials already deposited on the substrate. Further, the masks are subject to thermal expansion during the organic LED material deposition process, reducing the deposition precision and limiting the resolution and size at which the pattern may be formed.

The use of polymer, rather than metal, masks is known in the prior art. For example, WO2006/111766, published Oct. 26, 2006, by Speakman et al., describes a method of manufacturing comprising applying a mask to substrate; forming a pattern in the mask; processing the substrate according to the pattern; and mechanically removing the mask from the substrate. A method of manufacturing an integrated circuit is also disclosed. However, this method creates significant particulate contamination that can deleteriously affect subsequent processing steps, for example, the deposition of materials or encapsulation of a device. In either of these cases, the subsequent location of a mask over a previously patterned area may damage materials in the previously patterned area or cause particulate contamination in the previously patterned area. Moreover, the removal of a mask may also cause particulate contamination in a previously patterned area.

Because light is emitted through an electrode, it is important that the electrode through which light is emitted be sufficiently light transmissive to avoid absorbing the emitted light. Typical prior-art materials used for such electrodes include indium tin oxide and very thin layers of metal. However, the current-carrying capacity of electrodes formed from these materials is limited, thereby limiting the amount of light that can be emitted.

In conventional integrated circuits, bus connections are provided over the substrate to provide power to circuitry in the integrated circuit. These busses are located directly on the substrate or on layers deposited on the substrate, for example, on planarization layers. In complex circuits, multiple levels of bus lines are located over the substrate and separated by insulating layers of material. For example, organic LED (OLED) displays sold by the Eastman Kodak Company utilize multiple bus lines located on the substrate and on various planarization layers. However, these busses are not useful to provide power to the light-transmissive upper electrode in an OLED device because conventional photolithographic techniques destroy the organic layers and a typically thin upper electrode employed in a top-emitting OLED device.

U.S. Pat. No. 6,995,035 entitled, "Method of making a top-emitting OLED device having improved power distribution" by Cok and VanSlyke describes a method of making a top-emitting OLED device, includes providing over a substrate, laterally spaced and optically opaque lower electrodes and upper-electrode busses which are electrically insulated from the lower electrodes; depositing an organic EL medium structure over the lower electrodes and the upper-electrode busses; selectively removing the organic EL medium structure over at least portions of the upper-electrode busses to reveal at least upper surfaces of the upper-electrode busses; and depositing a light-transmissive upper-electrode over the organic EL medium structure so that such upper electrode is in electrical contact with at least upper surfaces of the upper-electrode busses. However, such a method tends to form particulate contamination when the organic EL medium structure is selectively removed. The particulate contamination may fall over the EL medium structure and inhibit current flow through the EL medium structure after a subsequent deposition of the light-transmissive upper electrode. This will cause unwanted dark spots.

Commonly assigned U.S. Pat. No. 7,030,553 entitled, "OLED Device having Microcavity Gamut Subpixels and a Within-Gamut Subpixel" by Winters et al, issued Apr. 18, 2006, describes an OLED device including an array of light-emitting pixels, wherein there are at least three gamut sub-pixels that produce at least three gamut-defining sub-pixels and at least one subpixel within the gamut, one of the gamut sub-pixels employing a reflective electrode and a semi-transparent electrode, to form a microcavity. The disclosure describes a top-emitter structure using a patterned cathode to form a semi-transparent electrode over the gamut-defining color sub-pixels and a transparent electrode over the within-gamut sub-pixel. However, these structures, as described, do not meet the need for improved conductivity within the top, transparent electrode.

There is a need, therefore, for an improved method and structure for providing improved manufacturing yields and power distribution in an upper electrode, and a method of making thereof.

SUMMARY OF THE INVENTION

The aforementioned need is addressed according to the present invention by providing an LED device that includes electrodes patterned over a substrate; the pattern forming several first electrodes separated by inter-electrode spacers. One or more light-emitting layers are formed over the first electrodes. A patterned conductive layer is formed over the one or more light-emitting layers and over the first electrodes in regions external to the inter-electrode spacers. A continuous unpatterned conductive layer is formed over both the patterned conductive layer and the inter-electrode spacers. Finally, a combination of the patterned and continuous unpatterned conductive layers forms a single, bi-layered, electrically continuous second electrode.

Another aspect of the invention provides a method of forming an LED device, including:
 a) providing a substrate;
 b) forming a plurality of patterned electrodes over the substrate, the pattern forming a plurality of first electrodes separated by inter-electrode spacers;
 c) depositing one or more light-emitting layers over the plurality of first electrodes;
 d) forming a patterned conductive layer over the one or more light-emitting layers and over the plurality of first electrodes in regions external to the inter-electrode spacers;
 e) forming a continuous, unpatterned conductive layer over both the patterned conductive layer and the inter-electrode spacers; and
 f) providing a single, bi-layered electrically continuous second electrode with a combination of the patterned and continuous unpatterned conductive layers.

BRIEF DESCRIPTION OF THE DRAWINGS

FIG. 1 is a schematic cross section of an LED device according to an embodiment of the present invention;

FIG. 6 is a schematic cross section of an LED device according to the prior art.

Figure 2A:
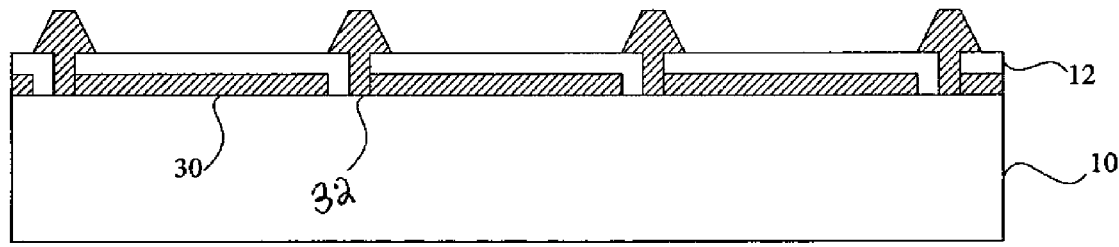
FIGS. 2A-2F are schematic cross sections of an LED device according to an embodiment of a method of the present invention at various steps of construction.

The drawings are necessarily of a schematic nature since layer thickness dimensions are frequently in the sub-micrometer ranges, while features representing lateral device dimensions can be in a range from ten micrometers to several hundred micrometers. Accordingly, the drawings are scaled for ease of visualization, rather than for dimensional accuracy.

DETAILED DESCRIPTION OF THE INVENTION

Referring to FIG. 1, in one embodiment of the present invention, an LED device comprises a substrate 10 on which is formed a plurality of laterally-spaced electrodes patterned over the substrate 10, the pattern forming a plurality of first electrodes 12 separated by inter-electrode spacers 18. One or more light-emitting layers 14 are formed over the plurality of first electrodes 12, and a patterned conductive layer 16 is formed over the one or more light-emitting layers 14 and over the plurality of first electrodes 12, in regions external to the inter-electrode spacers 18. A continuous unpatterned conductive layer 17 is formed over both the patterned conductive layer 16 and the inter-electrode spacers 18, wherein a combination of the patterned and continuous unpatterned conductive layers 16, 17 form a single, bi-layered electrically continuous second electrode 20. By regions external to the inter-electrode spacers 18 is meant that the materials forming the patterned conductive layer 16 are deposited continuously over the first electrodes 12, but are not present over at least some portion of the inter-electrode spacers 18, thereby forming a patterned layer 16.

The present invention may be employed in either top- or bottom-emitting configurations. In a top-emitting configuration, the first electrodes 12 are reflective and both the patterned and continuous conductive layers 16, 17 are transparent or semi-transparent. In a bottom-emitting configuration, the plurality of first electrodes 12 and the substrate 10 are transparent or semi-transparent and either or both of the patterned and continuous conductive layers 16, 17 are reflective. In one particular embodiment of the present invention, the plurality of first electrodes 12 are reflective, the patterned conductive layer 16 is transparent, and the continuous conductive layer is semi-transparent 17. In such an embodiment, it can be useful to employ an optical absorption-reduction layer 19 (shown in FIG. 5C) to reduce the absorption of light in the semi-transparent continuous conductive layer 17. Such an optical absorption-reduction layer 19 can be electrically conductive, for example, comprising a metal oxide such as ITO or aluminum zinc oxide. In other embodiments, the thickness of at least some of the patterned, conductive layer 16 is different over at least some of the plurality of first electrodes 12 than over others of the plurality of first electrodes 12 (FIG. 5). Such variations in thickness in the patterned, conductive layer can optimize the light output for different colors of light emission.

The light-emitting layer 14 can comprise organic light-emitting materials, inorganic light-emitting materials, e.g. phosphorescent materials, or light-emitting quantum dots in a semi-conducting matrix. Different light-emitting materials, emitting different colors of light (e.g. red, green, and blue), can be deposited over different first electrodes 12 in the light-emitting layer 14. Alternatively, the same materials emitting the same color of light (e.g. white) can be employed over the different first electrodes 12 in the light-emitting layer 14. Color filters (not shown), arranged over (for a top-emitter) or under (for a bottom-emitter), can be provided to make colored light. The first electrodes 12 can comprise indium tin oxide or aluminum zinc oxide, for example, if they are transparent; or a metal, for example, aluminum or silver or various metallic alloys, if they are reflective. The patterned and continuous conductive layers 16, 17 may likewise comprise indium tin oxide, for example, if they are transparent, or a metal, for example aluminum or silver if they are reflective. The inter-electrode spacer 18 may comprise one or more of a variety of materials, for example, a resin, a silicon oxide, or a silicon nitride. In order to prevent electrical shorts between adjacent first electrodes 12, the inter-electrode spacers 18 can comprise electrically insulating materials 32 that separate the plurality of first electrodes 12 from each other. The inter-electrode spacers 18 can comprise radiation-absorbing material, for example, black material such as carbon black or chrome oxide. The inter-electrode spacers 18 can comprise structures or simply gaps between the patterned electrodes 12. All of these materials and their deposition (for example, using sputtering or evaporation) and patterning (for example, using photolithography or masks) are known in the art. Such spacers 18 and patterned electrodes 12 formed over a substrate 10 have been commercially manufactured for display devices by applicants.

As used herein, the inter-electrode spacers 18 serve to separate the sub-pixels electrically and it is contemplated that the deposition of materials (e.g. the light-emitting layers 14 and, especially, the patterned conductive layer 16) over the first electrodes 12 is performed through a mask. As is well known, masks have a mechanical tolerance and when the patterned conductive layer 16 is formed over the one or more light-emitting layers 14 and over only the plurality of first electrodes 12 in regions external to the inter-electrode spacers 18 it is anticipated that some material may be deposited over the inter-electrode spacers 18. However, such deposition is incidental to the objective of coating materials over the first electrodes 12 and only occurs because it is essential to uniformly coat the area over the first electrodes 12, and because of inevitable mask tolerances. It is even possible that material may be deposited over the entire inter-electrode spacer 18 area; however, such deposition can be done in different deposition steps and can result in no coverage or variable coverage over the inter-electrode spacer 18 area so that the patterned conductive layer 16 is, in fact patterned. Moreover, the thickness of the patterned conductive layer 16 over the first electrodes 12 may be varied to provide optical tuning of the sub-pixel, as shown in FIG. 5.

Figure 5A:
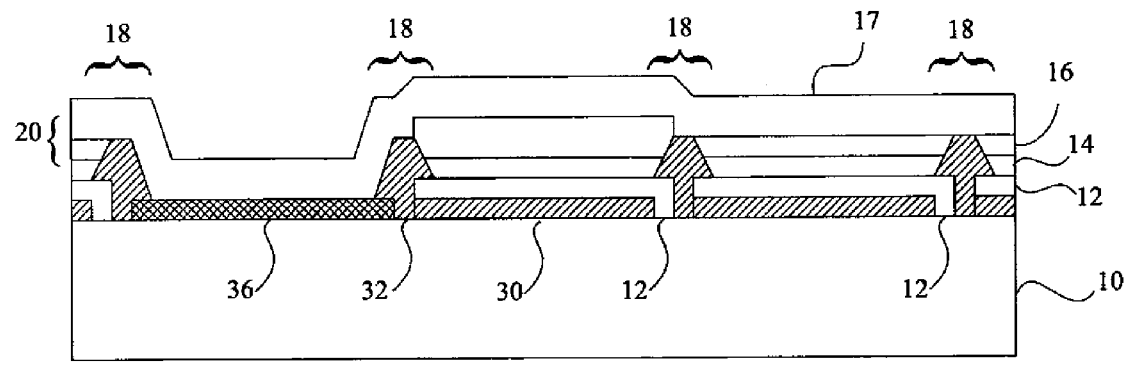
FIGS. 5A, 5B, and 5C are schematic cross sections of an LED device having an electrode buss according to alternative embodiments of the present invention.
Figure 5B:
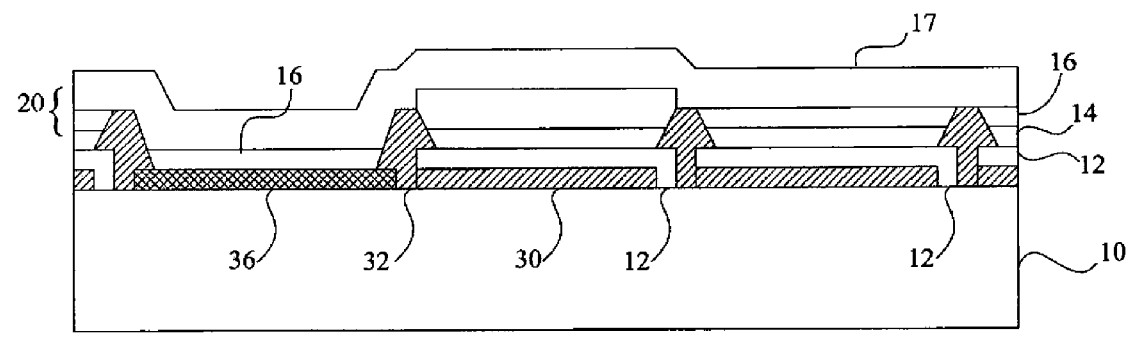
Figure 5C:
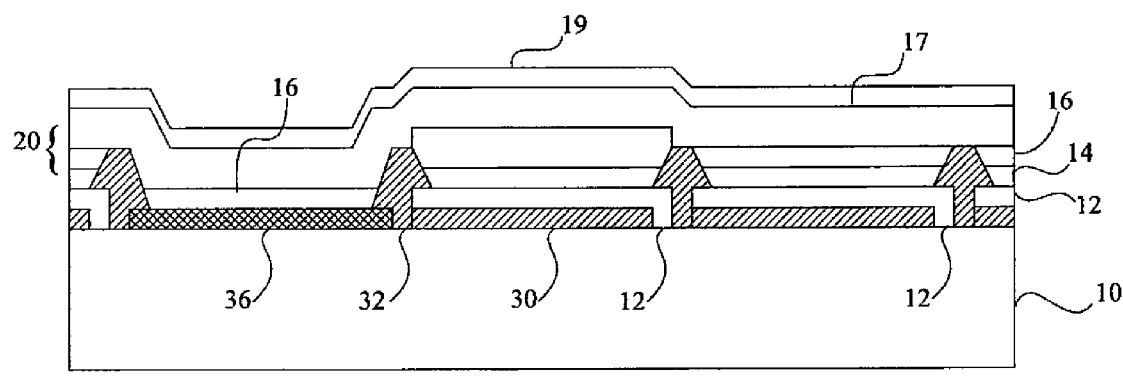

Referring to FIG. 5A, in a further embodiment of the present invention, an electrode buss 36, electrically continuous with the single, bi-layered electrically continuous second electrode 20, and electrically insulated from the first electrodes 12, can be formed over a substrate 10 to provide additional electrical conductivity to the second electrode 20. This can be particularly useful if the second conductive layer 17 is formed from a transparent metal oxide, such as indium tin oxide. Referring to FIG. 5B, in another embodiment of the present invention, a first conductive layer 16 can be formed over the electrode buss 36 and be separated from the first electrodes 12 by inter-electrode separators 18 in a manner similar to that of the light-emitting elements defined by the first electrodes 12, the light-emitting layer 14, and the second electrode 20.

Referring to FIGS. 2A-2F, an LED device according to another embodiment can be formed by first providing a substrate 10 and forming thereon a plurality of patterned electrodes 12 over the substrate 10, the pattern forming a plurality of first electrodes separated by inter-electrode spacers 18 (FIG. 2A). The inter-electrode spacers 18 also serve to electrically insulate thin-film electronic components 30 formed over the substrate 10 and to electrically insulate the plurality of first electrodes, one from another. The thin-film electronic components 30 provide current to the first electrodes 12, for example, as in an active-matrix device. Alternatively, the thin-film electronic components 30 may not be formed over the substrate 10 and a passive-matrix control scheme is used (not shown). The present invention can be employed with both active- and passive-matrix control methods.

Figure 2B:
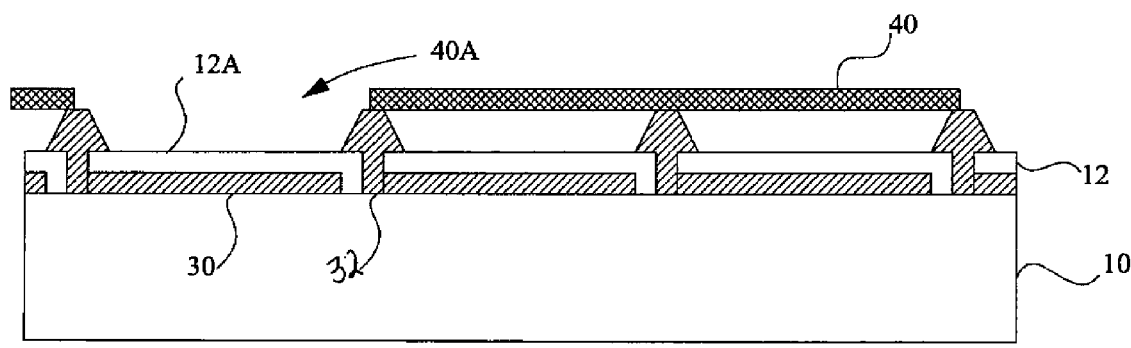
Figure 2C:
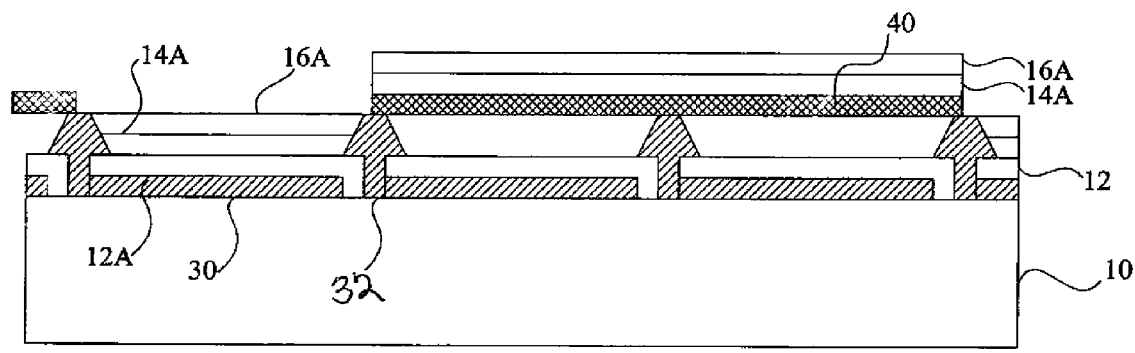
Figure 2D:
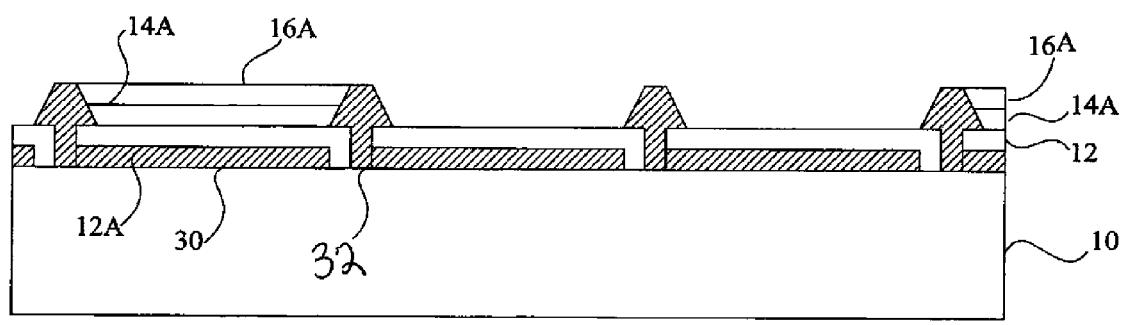
Figure 2E:
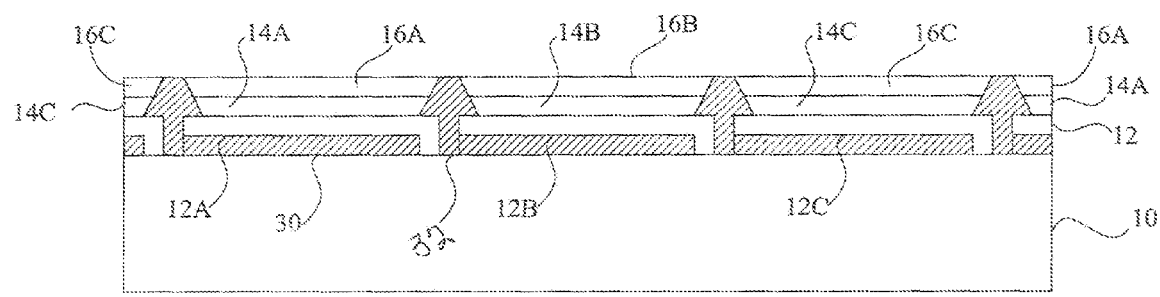

Referring to FIG. 2B, a mask 40 can be mechanically located over the substrate 10 exposing at least one first electrode 12A through a mask opening 40A. One or more light-emitting layers 14A are deposited over the exposed first electrode 12A through the opening 40A in the mask 40 and over the remainder of the mask 40, and can include charge-control layers as well as multiple light-emitting layers (FIG. 2C). A conductive layer 16A is likewise deposited through the openings 40A in the mask 40 and over the remainder of the mask 40, and over the light-emitting layer 14A. The mask 40 can be mechanically removed (FIG. 2D). Upon removal of the mask 40, the patterned light-emitting layer 14A and the patterned, conductive layer 16A remain formed on the first electrode 12A and external to the inter-electrode spacers 18 (i.e. material is not formed over at least some portions of the inter-electrode spacers 18, so that the layers 14A and 16A are formed continuously over the first electrode 12A, but not over the inter-electrode spacers 18). The patterned layers can be deposited by evaporation or sputtering through the mask. Alternatively, coating means such as spin or curtain coating can be employed. Similarly, second and third masking steps repeating the steps of FIGS. 2A-2D, but exposing first electrodes 12B and 12C using masks 40 having different opening locations, respectively, can be employed to deposit light-emitting layers 14B, 14C and patterned, conductive layers 16B, 16C through the mask openings. The materials used over the different first electrodes (e.g. 12A, 12B, 12C) can comprise different materials (for example, emitting different red, green, and blue colors of light) or can comprise the same materials (for example, emitting white light). After the removal of the third mask 40, the structure shown in FIG. 2E can be obtained.

Figure 2F:
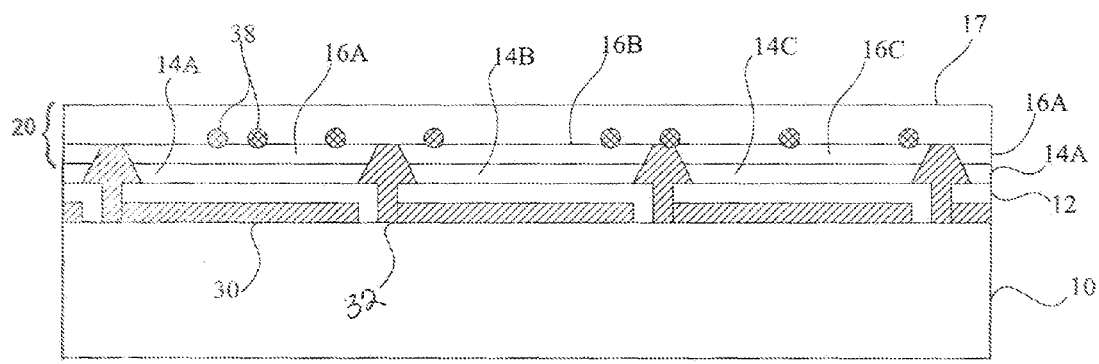

Referring to FIG. 2F, after the removal of the third mask 40, a continuous, unpatterned conductive layer 17 can be formed over both the patterned conductive layer 16A, 16B, 16C comprising layer 16 and the inter-electrode spacers 18. The combination of the patterned and continuous conductive layers 16, 17, respectively, forms a single, electrically continuous second electrode 20. The single, electrically continuous second electrode 20 can be thicker (e.g. 10-1000 nm) than the patterned conductive layers 16 (e.g. 1-10 nm), however, no such restriction in absolute or relative thickness is necessary for the present invention. Since various portions of the patterned conductive layers 16 are likely to be patterned sequentially, it can be preferable to make them thin (and quickly formed), while the continuous unpatterned conductive layer 17 can be formed in a single manufacturing step, thereby improving manufacturing cycle time. Moreover, the continuous unpatterned conductive layer 17 must carry current for the entire electrode, and hence a thicker layer can provide greater conductivity, reducing voltage drop across the device.

The present invention provides improved manufacturing yields over prior-art methods employing masks for at least two reasons. First, the repeated application of masks 40 over the surface of the substrate 10 can damage delicate materials in the light-emitting layer 14. By providing a patterned, conductive layer 16 over the light-emitting layer 14 (e.g. comprising ITO or a metal), delicate materials in the light-emitting layer 14 are protected from damage (particularly if small-molecule organic materials are employed). It is known that ITO and metals provide a robust, durable surface that is resistant to mechanical and chemical stress. Second, patterned, conductive layer 16 can provide protection against particle contamination induced by the repeated applications of masks 40. Referring to FIG. 2F, particles 38 may be inadvertently caused by the repeated location of the mask 40 over the substrate 10. Such particles 38 can damage the delicate materials in the light-emitting layer 14. Moreover, if contaminating particles 38 are located between the light-emitting layers 14 and an electrode 16 (as in the prior art), the contaminating particles 38 prevent electrical current from flowing through the light-emitting layer 14 at the location of the contaminating particles 38, thereby causing a dark spot in that location. By employing the present invention and providing patterned conductive layers 16 over the light-emitting layer 14 formed without a mask change (as described above), any particulate contamination caused by a mask change will be located (as shown in FIG. 2F) over the patterned conductive layers 16 and under the unpatterned, continuous conductive layer 17. Hence, current can flow from the unpatterned, continuous conductive layer 17 into the patterned conductive layers 16 through the plane of the patterned conductive layers 16 under the particles 38 and thence through the light-emitting layer 14, even at the location of the contaminating particles 38, thereby causing light to be emitted at the location of the contaminating particles 38.

While FIG. 2A shows the first, patterned electrodes 12 formed over the substrate, for example, by using photolithographic methods known in the art, the patterned electrodes 12 can also be deposited through a mask and as part of the same mask location and removal process as is employed to deposit the patterned layers of light-emitting material and patterned conductive material (layers 14 and 16 shown in FIG. 2C). Hence, electrically-conductive materials (such as metal oxides, metals, or metal alloys) can be deposited through the mask, e.g. comprising electrodes or conductive layers, as well as light-emitting materials.

Figure 3A:
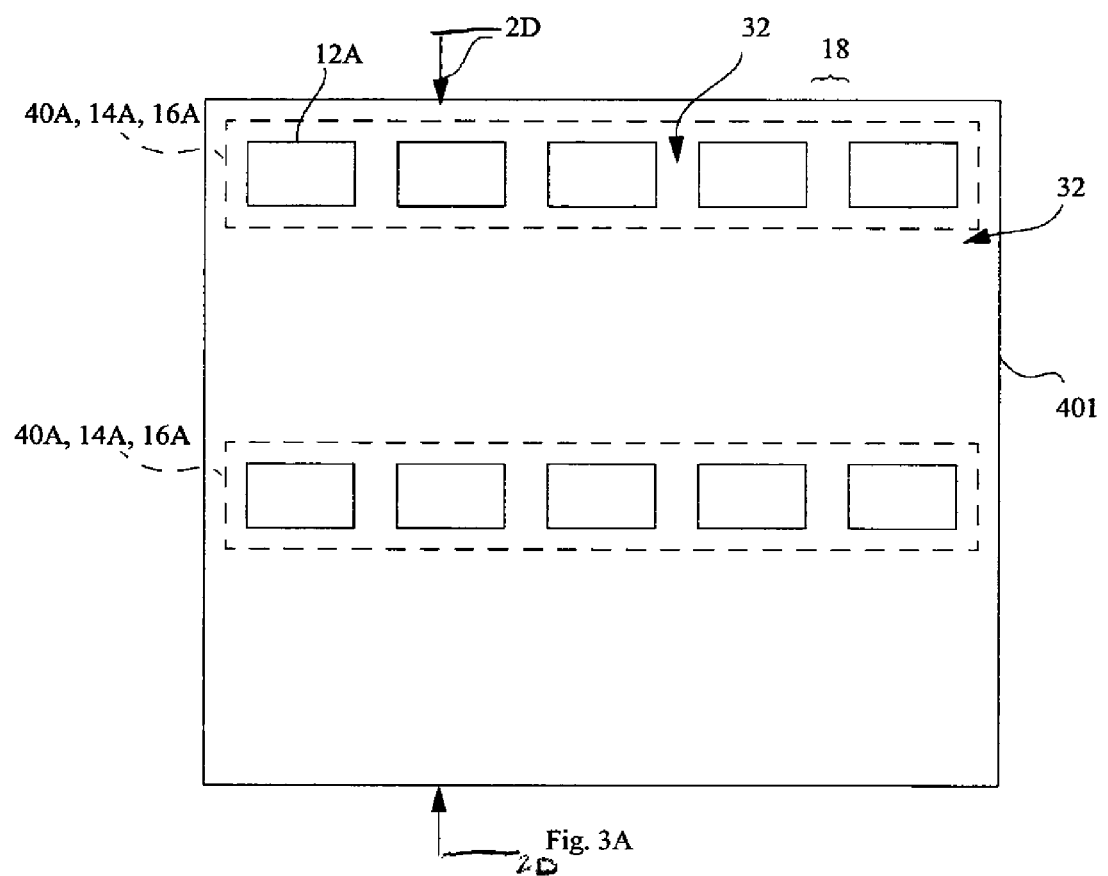
FIGS. 3A-3D are schematic top-views of an LED device and multiple masks according to an embodiment of an alternative method of the present invention at various steps of construction.
Figure 3B:
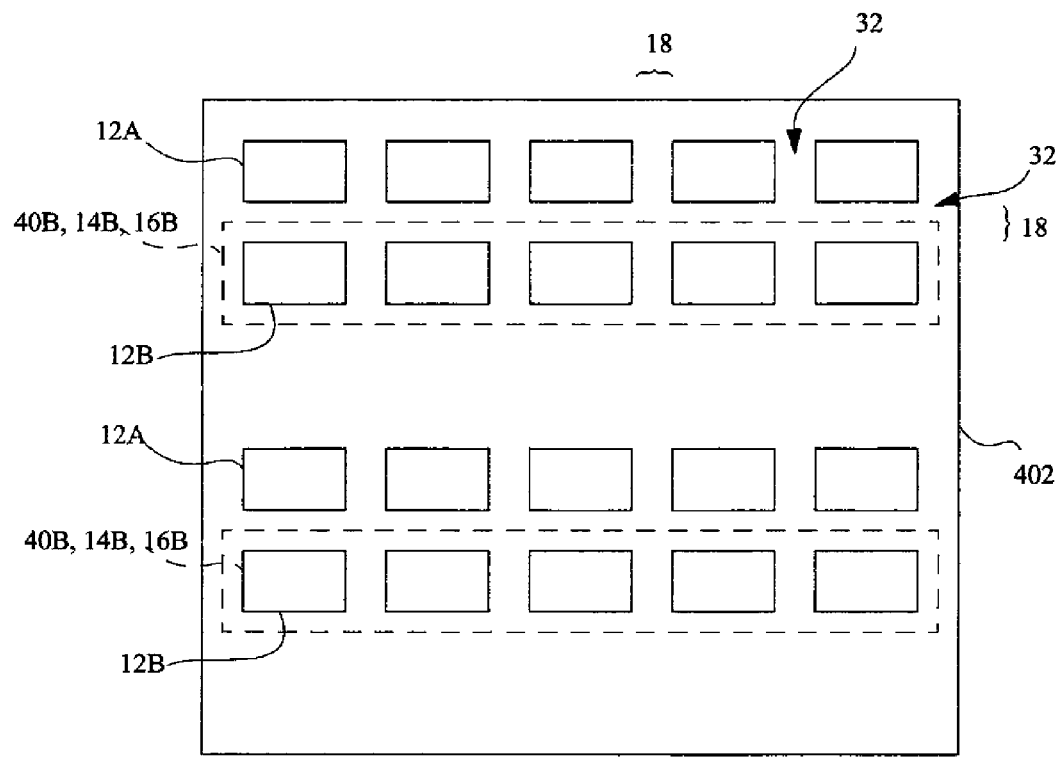
Figure 3C:
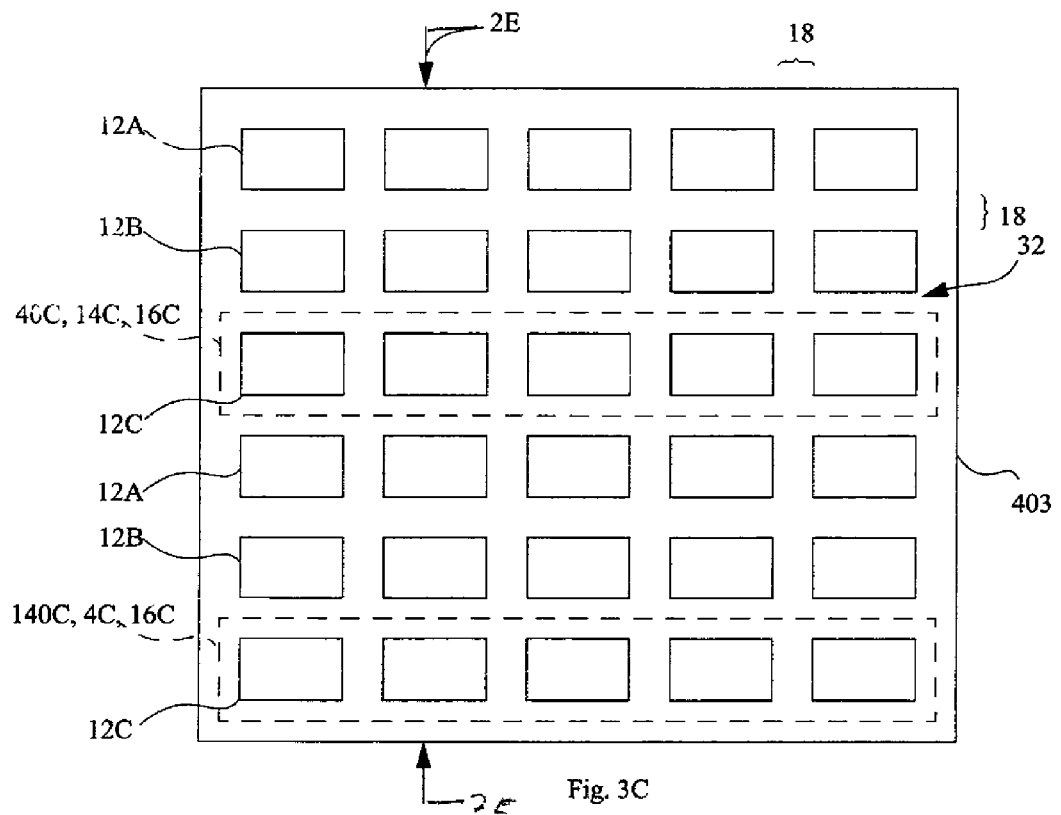
Figure 3D:
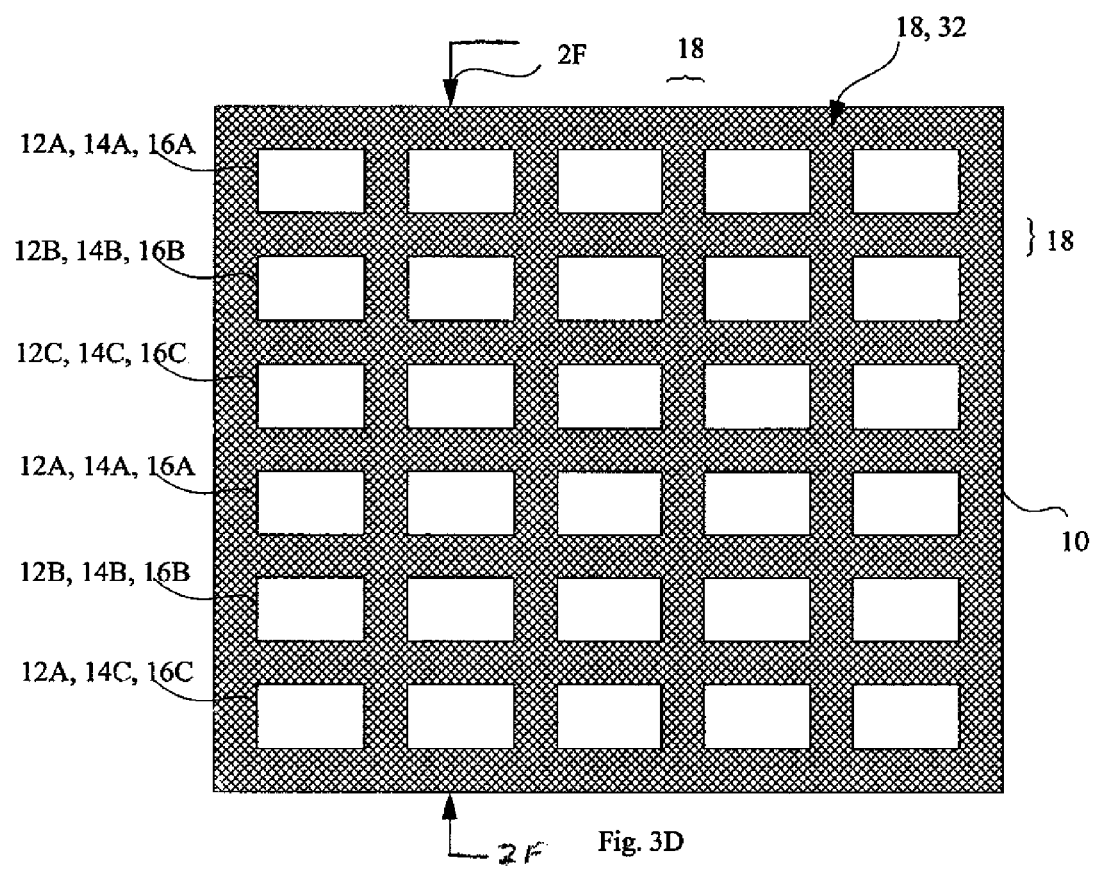

Referring to FIG. 3A in a top-view illustration, a mask 401 located over a substrate (not shown) has openings 40A formed in the mask 401 through which materials comprising layers 14A and 16A are deposited over first electrodes 12A. As shown in FIG. 3A, the mask 401 also covers at least a portion of the inter-electrode spacers 18. FIG. 2D illustrates the structure taken through the cross section A as indicated in FIG. 3A. In a second masking step shown in FIG. 3B, a second mask 402 located over a substrate (not shown) has openings 40B formed in the mask 402 through which materials comprising layers 14B and 16B are deposited over first electrodes 12B. As shown in FIG. 3B, the mask 402 also covers at least a portion of the inter-electrode spacers 18. In a third masking step shown in FIG. 3C, a third mask 403 located over a substrate (not shown) has openings 40C formed in the mask 403 through which materials comprising layers 14C and 16C are deposited over first electrodes 12C. As shown in FIG. 3C, the mask 403 also covers at least a portion of the inter-electrode spacers 18. At the conclusions of these steps, the cross section through line B results in the structure shown in FIG. 2E. A final deposition of the continuous, unpatterned conductive layer 17 completes the device, as shown along line C in FIG. 3D and in cross section in FIG. 2F.

Figure 4:
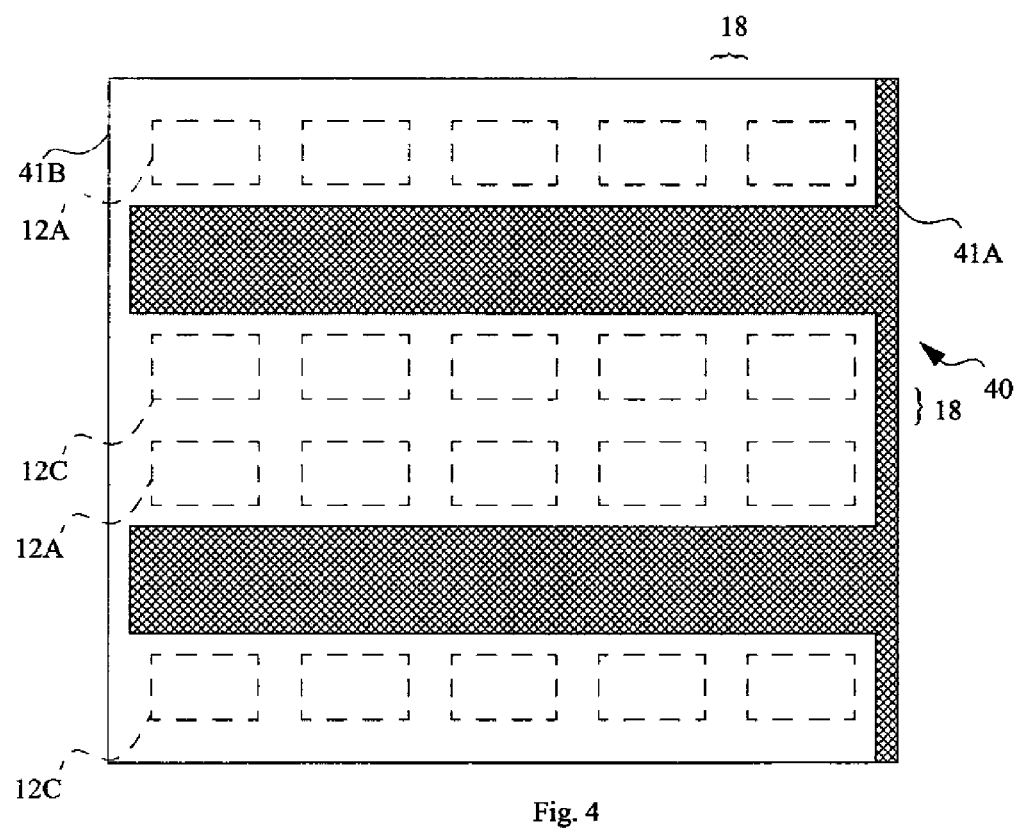
FIG. 4 is a schematic top-view of a segmented mask and an LED device useful in an embodiment of yet another method of the present invention.

Any of a variety of methods may be employed to provide a mask 40 over the substrate 10. Conventional metal shadow-masks mechanically located over, and removed from, the substrate may be employed, as practiced in the art. Alternatively, a sheet of masking material (e.g. a polymer) can be mechanically located over the substrate, portions of the masking material sheet removed to form a mask with openings, material deposited through the mask openings, and the mask mechanically removed. The portions of the masking material sheet can be removed by ablation, for example by employing a laser to ablate all of the material in the mask openings. Alternatively, ablation or other processing means (e.g. photolithography) can be employed to segment a perimeter around the opening portions of the masking material sheet and the opening portions mechanically removed. Referring to FIG. 4, a mask 40 is segmented into contiguous portions 41A and 41B. Portion 41A corresponds to mask openings through which materials can be deposited over first electrodes 12B (not shown). Portion 41B covers the remainder of the substrate 10 and first electrodes 12A and 12C. By segmenting the perimeter of portion 41A, mechanically separating portions 41A from 41B, and mechanically removing portion 41A, a mask having suitable deposition openings can be made. Similarly, masks having openings over first electrodes 12A or 12C can be made and employed in subsequent steps to form the patterned conductive layer 16 and, optionally, layer 14. By employing energy-absorbing materials in the inter-electrode spacers 18, ablation in the perimeter areas may be facilitated.

As taught in the prior art, a particulate contamination removal system may be employed to reduce the level of particulate contamination, but may not wholly prevent such contamination.

In accordance with various embodiments of the present invention, the method further includes the steps of making a top-emitting passive- or active-matrix LED device, or an organic or inorganic LED device, including an OLED device.

Useful electrically insulative substrates 10 include glass substrates, quartz substrates, plastic substrates, ceramic substrates, and substrates having an electrically insulative surface layer provided over an otherwise electrically conductive substrate body.

The electrodes 12, 16 may be made of a metal, a metal alloy, or of a multilayer metal sandwich, and are formed at a thickness (not indicated in the drawings) selected to provide sufficiently high electrical conductivity, long-term physical and chemical stability, and adhesion to the substrate 10 surface. Additionally, the selection of a metal has to be viewed in terms of a propensity to inject positive charge carriers (holes)

into an EL medium structure 14. A metal having a work function ≧4.0 eV is considered to have acceptable hole-injecting propensity. Hole-injecting propensity can be improved by providing a hole-injecting layer (not shown) over the first electrodes 12 (for a configuration in which the lower electrodes 12 are anodes). Particularly useful materials for forming a hole-injecting layer include conductive metal oxides such as, for example, indium-tin oxide (ITO), phthalocyanine compounds such as, for example, copper phthalocyanine, and plasma-deposited fluorocarbon materials (CFx).

In view of the above considerations, particularly useful metals include silver, gold, platinum, iridium, tantalum, tungsten, molybdenum, nickel, and aluminum, or selected alloys, or sandwich structures of such metals.

Various known methods can be chosen to provide the pattern of the first electrodes 12, patterned layers 14 and 16, busses, and bus connector pads (not shown). Among such known methods are printing, vapor deposition through a pattern mask, vapor deposition of a pattern defined by a photoresist pattern in a so-called "lift-off" process, and patterning a uniformly deposited layer by selective etching via a photoresist etch mask. The inter-electrode spacers 18 providing electrical insulation can be an organic photoresist material, which has been patterned by a photolithographic process.

The EL medium structure comprising the light-emitting layer 14 can be a multilayer structure, which includes, in sequence, a hole-injecting layer, a hole-transporting layer, a light-emitting layer, an electron-transporting layer, and an electron-injecting layer. Such multilayer structures are well known in the art of designing and making organic and inorganic LED devices. The EL medium structure can include small molecule layers and polymer layers, as well as quantum dots formed in a common layer, for example such as a polycrystalline, semiconductor matrix.

For a top-emitting multicolor device or a full-color LED device, the light-emitting layer 14 of the EL medium structure is deposited selectively over selected first electrodes 12. For example, a red light-emitting layer may be formed over some lower electrodes 12A. Green and blue light-emitting layers may be formed similarly e.g. over first electrodes 12B, 12C, respectively. The light-emitting layers 14A, 14B, 14C may overlap or abut over the inter-electrode spacers 18 or over the upper electrode busses 36. Other layers of the multilayer EL medium structure can be (but need not be) commonly deposited over all first electrodes 12, upper electrode busses 36, and inter-electrode spacers 18. In particular, if a sequential series of masks are employed, it may be preferred to pattern all of the EL medium layers comprising layer 14, and in particular those layers formed over the light-emitting layer, so as to reduce the number of different mask location and removal steps.

A light-transmissive upper electrode 20 can be formed of a thin metal film or of a layer of relatively transparent and electrically conductive metal oxides, or a combination of these materials. An electron-injecting interfacial layer, for example a lithium fluoride (LiF) interfacial layer, may be formed as an uppermost layer of the light-emitting layer 14, followed by a layer of aluminum (Al). In combination, layers of these materials can comprise a light-transmissive upper electrode 20, as described, for example, in U.S. Pat. No. 5,677,572. Other useful upper electrode material sets include, but are not limited to, those disclosed in U.S. Pat. Nos. 5,059,861 and 5,059,862. The term transparent as used in this specification includes materials, which pass sufficient light to permit the LED device to operate effectively as a top-emitter. For example, alternative thin films of transparent electrode material useful for the present invention include indium tin oxide (ITO) in combination with an electron-injecting layer or alloys of a low-work function material with other metals or alloys, for example, Li/Ag, LiF/Al/Ag, and alloys of magnesium with other metals (such as MgAg, MgAl, MgSn, MgIn, or MgZn, with or without an additional layer of Ag or any other highly conductive metals or alloys).

Optically transparent electrodes have been described in more detail in U.S. Pat. Nos. 4,885,211; 5,247,190; JP 3,234,963; U.S. Pat. Nos. 5,703,436; 5,608,287; 5,837,391, 5,677,572; 5,776,622; 5,776,623; 5,714,838; 5,969,474; 5,739,545; 5,981,306; 6,137,223; 6,140,763, 6,172,459; EP 1 076 368; and U.S. Pat. Nos. 6,278,236 and 6,284,393. A transparent electrode is typically deposited by evaporation, sputtering, or chemical vapor deposition. When needed, patterning can be achieved through many well known methods including, but not limited to, through-mask deposition, integral shadow masking, for example, as described in U.S. Pat. Nos. 5,276,380 and 6,221,563, and EP 0 732 868, by laser ablation, and by selective chemical vapor deposition.

The electrical contact between the light-transmissive upper electrode 20 and each one of the metallic upper-electrode busses 36 provides for improved power distribution within the upper electrode 20, thereby permitting the use of substantially light-transmissive materials in forming the upper electrode 20. Stated differently, undesirable voltage drops along or across a light-transmissive upper electrode 20 can be substantially reduced or avoided by providing multiple electrical connections between such electrode and metallic, electrically conductive upper-electrode busses 36. Upper-electrode busses 36 can extend laterally along or across an entire LED device and may be disposed in spaces between laterally spaced lower electrodes 12, i.e. the upper electrode busses may also comprise a portion of a inter-electrode spacer 18 structure. Each one of the upper-electrode busses 36 is in electrical contact with the common light-transmissive upper electrode 20 to provide improved uniformity of current distribution or of power distribution in this common upper electrode.

The invention has been described in detail with particular reference to certain preferred embodiments thereof, but it will be understood that variations and modifications can be effected within the spirit and scope of the invention. It will be understood that the method of the present invention may be applied to different classes of OLED devices such as polymer OLED devices (either active- or passive-matrix), top-emitting passive matrix OLED devices, and top-emitting active-matrix OLED devices, as well as inorganic LED devices.

PARTS LIST

A, B, C cross-section line
10 substrate
12, 12A, 12B, 12C first electrode
14, 14A, 14B, 14C light-emitting layer
16, 16A, 16B, 16C patterned conductive layer
17 unpatterned, continuous conductive layer
18 inter-electrode spacers, insulator
19 absorption reduction layer
20 second electrode
30 thin-film electronic components
32 insulator
36 second-electrode buss
38 particulate contamination
40 mask
40A, 40B, 40C mask opening
41A, 41B contiguous mask portions
401 mask 402 mask
403 mask

What is claimed is:

1. An LED device, comprising:
a) a substrate;
b) a plurality of electrodes patterned over the substrate, the pattern forming a plurality of first electrodes separated by inter-electrode spacers;
c) one or more light-emitting layers formed over the plurality of first electrodes;
d) a patterned conductive layer formed over the one or more light-emitting layers and over the plurality of first electrodes in regions external to the inter-electrode spacers;
e) a continuous unpatterned conductive layer formed over both the patterned conductive layer and the inter-electrode spacers; and
f) wherein a combination of the patterned and continuous unpatterned conductive layers form a single, bi-layered, electrically continuous second electrode, and
wherein the thickness of at least some of the patterned, conductive layer is different over at least some of the plurality of first electrodes than over others of the plurality of first electrodes.

2. The LED device of claim 1, wherein the plurality of first electrodes are transparent and either or both of the patterned and continuous unpatterned conductive layers are reflective; or wherein the plurality of first electrodes are reflective and both the patterned and continuous unpatterned conductive layers are transparent.

3. The LED device of claim 1, wherein the plurality of first electrodes are reflective, the patterned conductive layer is transparent, and the continuous unpatterned conductive layer is semi-transparent.

4. The LED device of claim 3, further comprising a transparent conductive layer formed over the semi-transparent, continuous unpatterned conductive layer.

5. The LED device of claim 1, wherein the light-emitting layer comprises organic light-emitting materials, inorganic phosphorescent light-emitting materials, or light-emitting quantum dots in a semiconducting matrix.

6. The LED device of claim 1, further comprising an electrode buss electrically continuous with the single, bi-layered, electrically continuous second electrode.

7. The LED device of claim 1, wherein the continuous, unpatterned conductive layer is thicker than the patterned conductive layer.

8. The LED device of claim 1, wherein different light-emitting materials, in the light-emitting layer, emit different colors of light over different first electrodes.

* * * * *